(12) United States Patent
Hoshi et al.

(10) Patent No.: US 9,365,922 B2
(45) Date of Patent: *Jun. 14, 2016

(54) FORMED ARTICLE, METHOD OF PRODUCING SAME, ELECTRONIC DEVICE MEMBER, AND ELECTRONIC DEVICE

(75) Inventors: Shinichi Hoshi, Kawagoe (JP); Masaharu Ito, Tokyo (JP); Kazue Uemura, Tokyo (JP); Yuta Suzuki, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 74 days.

This patent is subject to a terminal disclaimer.

(21) Appl. No.: 13/321,687

(22) PCT Filed: May 21, 2010

(86) PCT No.: PCT/JP2010/058668
§ 371 (c)(1),
(2), (4) Date: Jan. 9, 2012

(87) PCT Pub. No.: WO2010/134609
PCT Pub. Date: Nov. 25, 2010

(65) Prior Publication Data
US 2012/0101221 A1    Apr. 26, 2012

(30) Foreign Application Priority Data

May 22, 2009    (JP) ................................ 2009-123913

(51) Int. Cl.
*C23C 14/48* (2006.01)
*H01L 31/049* (2014.01)
(Continued)

(52) U.S. Cl.
CPC ................. *C23C 14/48* (2013.01); *B32B 27/06* (2013.01); *H01L 31/049* (2014.12);
(Continued)

(58) Field of Classification Search
None
See application file for complete search history.

(56) References Cited

U.S. PATENT DOCUMENTS

| 5,143,747 A | 9/1992 | Matossian et al. |
| 5,458,753 A | 10/1995 | Sato et al. |

(Continued)

FOREIGN PATENT DOCUMENTS

| DE | 10 2004 004 177 A1 | 9/2005 |
| EP | 0 285 870 A2 | 10/1988 |

(Continued)

OTHER PUBLICATIONS

JP 2003008179 English machine translation (2003).*
(Continued)

*Primary Examiner* — Kenneth Stachel
(74) *Attorney, Agent, or Firm* — Birch, Stewart, Kolasch & Birch, LLP

(57) ABSTRACT

A formed article comprising a gas barrier layer that is formed of a material including at least an oxygen atom, a carbon atom, and a silicon atom, the gas barrier layer including an area (A) where an oxygen atom content rate gradually decreases, and a carbon atom content rate gradually increases in a depth direction from a surface, the area (A) including a partial area (A1) and a partial area (A2), the (A1) having a specific oxygen, carbon and silicon content, and the (A2) having a specific oxygen, carbon and silicon content; a method of producing the same; an electronic device member; an electronic device. The formed article exhibits an excellent gas barrier capability, excellent bendability, excellent adhesion, and excellent surface flatness.

6 Claims, 6 Drawing Sheets

(51) Int. Cl.
*B32B 27/06* (2006.01)
*G02F 1/1333* (2006.01)

(52) U.S. Cl.
CPC .. *B32B 2307/7244* (2013.01); *G02F 1/133305* (2013.01); *G02F 2201/501* (2013.01); *G02F 2201/503* (2013.01); *Y02E 10/50* (2013.01)

(56) References Cited

U.S. PATENT DOCUMENTS

| | | | |
|---|---|---|---|
| 5,907,382 A | 5/1999 | Kajiura et al. | |
| 5,989,945 A | 11/1999 | Yudasaka et al. | |
| 6,194,328 B1 | 2/2001 | Chen et al. | |
| 6,251,981 B1 | 6/2001 | Tanaka et al. | |
| 6,300,641 B1 | 10/2001 | Koh et al. | |
| 6,352,931 B1 | 3/2002 | Seta et al. | |
| 6,416,817 B1 | 7/2002 | Rangwalla et al. | |
| 6,828,381 B1 | 12/2004 | Armbrust et al. | |
| 2001/0018491 A1 | 8/2001 | Shiono et al. | |
| 2002/0034885 A1 | 3/2002 | Shindo | |
| 2002/0059899 A1 | 5/2002 | Seta et al. | |
| 2002/0063830 A1 | 5/2002 | Callegari et al. | |
| 2002/0102843 A1 | 8/2002 | Seta et al. | |
| 2003/0224611 A1 | 12/2003 | Seta et al. | |
| 2003/0228475 A1 | 12/2003 | Komada | |
| 2004/0046497 A1 | 3/2004 | Schaepkens et al. | |
| 2004/0116555 A1 | 6/2004 | Naruse et al. | |
| 2004/0146660 A1 | 7/2004 | Goodwin et al. | |
| 2004/0265554 A1 | 12/2004 | Miyadera et al. | |
| 2005/0017633 A1 | 1/2005 | Miyadera | |
| 2005/0079380 A1 | 4/2005 | Iwanaga | |
| 2005/0082674 A1 | 4/2005 | Seta et al. | |
| 2005/0202259 A1 | 9/2005 | Korevaar et al. | |
| 2005/0287307 A1 | 12/2005 | Singh et al. | |
| 2006/0017162 A1 | 1/2006 | Seta et al. | |
| 2006/0232735 A1 | 10/2006 | Hokazono et al. | |
| 2007/0268089 A1 | 11/2007 | McKenzie et al. | |
| 2008/0018230 A1 | 1/2008 | Yamada et al. | |
| 2008/0096014 A1 | 4/2008 | Griesser et al. | |
| 2008/0318067 A1 | 12/2008 | Itoh et al. | |
| 2009/0021150 A1 | 1/2009 | Kim et al. | |
| 2009/0022907 A1 | 1/2009 | Kim et al. | |
| 2009/0110892 A1 | 4/2009 | Erlat et al. | |
| 2009/0130463 A1 | 5/2009 | Albaugh et al. | |
| 2009/0139564 A1 | 6/2009 | Miyaji et al. | |
| 2009/0148633 A1 | 6/2009 | Inagaki et al. | |
| 2009/0214882 A1 | 8/2009 | Sakakura | |
| 2009/0252975 A1 | 10/2009 | Lee et al. | |
| 2010/0003482 A1 | 1/2010 | Fukuda | |
| 2010/0003483 A1 | 1/2010 | Fukuda | |
| 2010/0216264 A1 | 8/2010 | Matsumoto et al. | |
| 2011/0185948 A1 | 8/2011 | Uemura et al. | |
| 2011/0189450 A1 | 8/2011 | Hoshi et al. | |
| 2011/0274933 A1 | 11/2011 | Hoshi et al. | |
| 2012/0064321 A1 | 3/2012 | Suzuki et al. | |
| 2012/0101221 A1 | 4/2012 | Hoshi et al. | |
| 2012/0108761 A1 | 5/2012 | Hoshi et al. | |
| 2012/0208086 A1 | 8/2012 | Plieth et al. | |
| 2012/0295120 A1 | 11/2012 | Nagamoto et al. | |

FOREIGN PATENT DOCUMENTS

| | | | |
|---|---|---|---|
| EP | 2 410 005 A1 | 1/2012 | |
| EP | 2 412 522 A1 | 2/2012 | |
| EP | 2 615 144 A1 | 7/2013 | |
| JP | 62-220330 A | 9/1987 | |
| JP | 5-185568 A | 7/1993 | |
| JP | 6-64105 A | 3/1994 | |
| JP | 6-187833 A | 7/1994 | |
| JP | 7-292321 A | 11/1995 | |
| JP | 8-45452 A | 2/1996 | |
| JP | 8-57560 A | 3/1996 | |
| JP | 8-174748 A | 7/1996 | |
| JP | 8-302043 A | 11/1996 | |
| JP | 9-10687 A | 1/1997 | |
| JP | 9-26755 A | 1/1997 | |
| JP | 9-124807 A | 5/1997 | |
| JP | 10-244613 A | 9/1998 | |
| JP | 10-249990 A | 9/1998 | |
| JP | 10-305542 A | 11/1998 | |
| JP | 2000-246830 A | 9/2000 | |
| JP | 2000-254996 A | 9/2000 | |
| JP | 2000-260870 A | 9/2000 | |
| JP | 2000-338901 A | 12/2000 | |
| JP | 2000-340166 A | 12/2000 | |
| JP | 2001-119051 A | 4/2001 | |
| JP | 2001207259 A * | 7/2001 | ............. C23C 14/48 |
| JP | 2002-18246 A | 1/2002 | |
| JP | 2002-105676 A | 4/2002 | |
| JP | 2003008179 A * | 1/2003 | ............. H05K 3/18 |
| JP | 2003-118029 A | 4/2003 | |
| JP | 2003-154596 A | 5/2003 | |
| JP | 2003-525995 A | 9/2003 | |
| JP | 2003-347570 A | 12/2003 | |
| JP | 2004-119138 A | 4/2004 | |
| JP | 2004-527642 A | 9/2004 | |
| JP | 2004-530790 A | 10/2004 | |
| JP | 2004-322489 A | 11/2004 | |
| JP | 2004-352966 A | 12/2004 | |
| JP | 2005-88431 A | 4/2005 | |
| JP | 2005-104025 A | 4/2005 | |
| JP | 2005-119155 A | 5/2005 | |
| JP | 2005-119160 A | 5/2005 | |
| JP | 2005-169994 A | 6/2005 | |
| JP | 2005-231039 A | 9/2005 | |
| JP | 2005-240061 A | 9/2005 | |
| JP | 2005-537963 A | 12/2005 | |
| JP | 2006-35737 A | 2/2006 | |
| JP | 2006-52376 A | 2/2006 | |
| JP | 2006-70238 A | 3/2006 | |
| JP | 2006-123306 A | 5/2006 | |
| JP | 2006-123307 A | 5/2006 | |
| JP | 2006-264118 A | 10/2006 | |
| JP | 2007-22075 A | 2/2007 | |
| JP | 2007-42616 A | 2/2007 | |
| JP | 2007-65644 A | 3/2007 | |
| JP | 2007-237588 A | 9/2007 | |
| JP | 2007-528447 A | 10/2007 | |
| JP | 2007-283726 A | 11/2007 | |
| JP | 2008-15500 A | 1/2008 | |
| JP | 2008-504687 A | 2/2008 | |
| JP | 2008-49601 A | 3/2008 | |
| JP | 2008-62498 A | 3/2008 | |
| JP | 2008-174792 A | 7/2008 | |
| JP | 2008-204683 A | 9/2008 | |
| JP | 2008-235165 A | 10/2008 | |
| JP | 2008-246893 A | 10/2008 | |
| JP | 2008-246894 A | 10/2008 | |
| JP | 2008-270115 A | 11/2008 | |
| JP | 2009-110897 A | 5/2009 | |
| JP | 2009-199812 A | 9/2009 | |
| JP | 2009-252574 A | 10/2009 | |
| JP | 2009-287006 A | 12/2009 | |
| JP | WO 2010/134609 A1 | 11/2010 | |
| JP | 2011-718 A | 1/2011 | |
| WO | WO 2006/015757 A1 | 2/2006 | |
| WO | WO 2006/090602 A1 | 8/2006 | |
| WO | WO 2007-040039 A1 | 4/2007 | |
| WO | WO 2007/044181 A2 | 4/2007 | |
| WO | WO 2008/096617 A1 | 8/2008 | |
| WO | WO 2010/002182 A2 | 1/2010 | |
| WO | WO 2010/021326 A1 | 2/2010 | |
| WO | WO 2010/024378 A1 | 3/2010 | |
| WO | WO 2010/067857 A1 | 6/2010 | |
| WO | WO 2010/107018 A1 | 9/2010 | |
| WO | WO 2010/134611 A1 | 11/2010 | |

OTHER PUBLICATIONS

"Luminescence as a Tool for Crosslinking Determination in Plasma Polysilylenes Prepared From Organosilanes", Schauer et al., (2000).*
English machine translation of JP 2001207259 (IPDL) (2001).*
CAS Registry No. 151772 74 6 Scifinder ACS (2014).*

(56) References Cited

OTHER PUBLICATIONS

Nakagawara et al., "Moisture-resistant ZnO transparent conductive films with Ga heavy doping," Applied Physics Letters (2006), vol. 89, 092904-1 to 092904-3.
International Search Report for PCT/JP2010/058668, mailed on Aug. 10, 2010.
Final Office Action issued Sep. 13, 2013, in U.S. Appl. No. 13/128,348.
Final Office Action issued Oct. 18, 2013, in U.S. Appl. No. 13/144,856.
International Search Report dated Dec. 1, 2009 for PCT/JP2009/064457.
International Search Report, dated Feb. 9, 2010 for PCT/JP2009/070728.
International Search Report, dated Jun. 1, 2010 for PCT/JP2010/052058.
Kobayashi et al., "Surface modification of silicone sheets and tubes using plasma-based ion implantation," Surface & Coatings Technology, vol. 201, 2007, pp. 8039-8042.
U.S. Office Action dated Apr. 16, 2013 for U.S. Appl. No. 13/055,274.
U.S. Office Action dated Feb. 14, 2013 for U.S. Appl. No. 13/128,348.
U.S. Office Action dated Mar. 15, 2013 for U.S. Appl. No. 13/144,856.
Non-Final Office Action issued Feb. 25, 2014, in U.S. Appl. No. 13/823,688.
Notice of Allowance issued Feb. 28, 2014, in U.S. Appl. No. 13/826,954.
Notice of Allowance issued Apr. 29, 2014, in U.S. Appl. No. 13/256,143.
United States Advisory Action for U.S. Appl. No. 13/055,274 dated Apr. 15, 2014.
United States Advisory Action for U.S. Appl. No. 13/128,348 dated Feb. 10, 2014.
United States Advisory Action for U.S. Appl. No. 13/144,856 dated Mar. 3, 2014.
United States Notice of Allowance for U.S. Appl. No. 13/256,143, dated Jun. 24, 2014.
United States Notice of Allowance, for U.S. Appl. No. 13/823,688, dated Jun. 4, 2014.
Extended European Search Report dated Feb. 5, 2014, issued in European Patent Application No. 11762771.1.
Extended European Search Report issued Feb. 17, 2014, in European Patent Application No. 11826800.2.
Extended European Search Report issued Mar. 27, 2014, in European Patent Application No. 11818032.2.
International Search Report issued Aug. 23, 2011, in PCT International Application No. PCT/J P2011/067046.
Non-Final Office Action issued Feb. 19, 2014, in U.S. Appl. No. 13/634,378.
Restriction Requirement issued Jan. 15, 2014, in U.S. Appl. No. 13/634,378.
Written Opinion of the International Search Authority issued Aug. 23, 2011, in PCT International Application No. PCT/JP2011/067046 (Japanese).
Final Office Action issued Nov. 7, 2013, in U.S. Appl. No. 13/055,274.
United States Office Action, dated Aug. 8, 2014, for U.S. Appl. No. 13/055,274.
Office Action issued Feb. 12, 2015, in U.S. Appl. No. 13/818,050.
Bodo, P. et al., "Titanium deposition onto ion-bombarded and plasma-treated polydimethylsiloxane: Surface modification, interface and adhesion", Thin Solid Films, Elsevier-Sequoia, Feb. 1, 1986, vol. 136, No. 1, pp. 147-159.
Extended European Search Report issued Sep. 25, 2014, in European Patent Application No. 10756100.3.
Igarashi, A. et al., "Structure and morphology of diamond-like carbon coated on nylon 66/poly(phenylene ether) alloy", J. of Molecular Structure, Elsevier, Amsterdam, NL, vol. 788, No, 1-3, May 8, 2006, pp. 238-245.
Tsuji, H et al., "Improvement of polydimethylsiloxane guide tube for nerve regeneration treatment by carbon negative-ion implantation", Nuclear Instruments and Methods in Physics Research, Section B: Beam Interactions with Materials and Atoms, Elsevier, May 1, 2003, vol. 206, pp. 507-511.
Balabanov, S. et al., "Spectral distribution of UV range diffuse reflectivity for Si+ ion implanted polymers", J. of Physics: Conference Series, institute of Publishing, Bristol, vol. 113, No. 1, May 1, 2008.
Office Action issued May 28, 2015, in U.S. Appl. No. 13/128,348.
Restriction Requirement issued Jun. 4, 2015, in U.S. Appl. No. 13/634,410.
Moriya et al., "Modification Effects in Ion-Implanted $SiO_2$ Spin-on-Glass," J. Electrochem. Soc. (May 1993), vol. 140, No. 5; pp. 1442-1450.
Office Action issued Jun. 8, 2015, in U.S. Appl. No. 13/144,856.
U.S. Office Action, dated Aug. 19, 2015, for U.S. Appl. No. 13/818,050.
Gelamo et al., "Infrafred spectroscopy investigation of various plasma-deposited polymer films irradiated with 170 keV He+ ions," Nuclear Instruments and Methods in Physics Research B (2006), vol. 249, pp. 162-166.
Office Action issued Feb. 5, 2013, in U.S. Appl. No. 14/484,573.
Final Office Action issued Feb. 27, 2015, in U.S. Appl. No. 13/055,274.
Nakano et al., "Effects of Si-C Bond Content on Film Properties of Organic Spin-on Glass," J. Electrochem. Soc. (Apr. 1995), vol. 142, No. 4, pp. 1303-1308.
Office Action issued Dec. 2, 2015, in U.S. Appl. No. 13/144,856.
Office Action issued Nov. 30, 2015, in U.S. Appl. No. 13/128,348.
Final Office Action issued Jan. 15, 2016, in U.S. Appl. No. 14/484,573.
Office Action issued Jan. 29, 2016, in U.S. Appl. No. 13/634,713.
Extended European Search Report for Application No. 11765502.7 dated Aug. 29, 2013.
International Search Report for International Application No. PCT/JP2010/055064 dated May 11, 2010.
International Search Report for International Application No. PCT/JP2011/051507 dated May 10, 2011 (with English translation).
International Search Report for International Application No. PCT/JP2011/057608 dated Apr. 26, 2011.
International Search Report for International Application No. PCT/JP2011/057610 dated Jul. 5, 2011.
International Search Report for International Application No. PCT/JP2011/071203 dated Nov. 8, 2011.
International Search Report for International Application No. PCT/JP2011/071208 dated Nov. 8, 2011.
International Search Report for International Application No. PCT/JP2011/071353 dated Nov. 8, 2011.
United States Office Action for copending U.S. Appl. No. 13/256,143 dated Aug. 6, 2013.
United States Office Action for copending U.S. Appl. No. 13/256,143 dated Nov. 21, 2013.
United States Office Action for copending U.S. Appl. No. 13/823,688 dated Nov. 8, 2013.
United States Office Action for copending U.S. Appl. No. 13/826,954 dated Nov. 7, 2013.
Office Action issued Feb. 12, 2016, in U.S. Appl. No. 13/818,050.
Office Action issued Oct. 7, 2015, in U.S. Appl. No. 13/634,410.

* cited by examiner

FORMED ARTICLE, METHOD OF PRODUCING SAME, ELECTRONIC DEVICE MEMBER, AND ELECTRONIC DEVICE

TECHNICAL FIELD

The present invention relates to a formed article, a method of producing the same, an electronic device member that includes the formed article, and an electronic device that includes the electronic device member.

BACKGROUND ART

A polymer formed article such as a plastic film is inexpensive and exhibits excellent workability. Therefore, such a polymer formed article is provided with a desired function, and used in various fields.

In recent years, use of a transparent plastic film as a substrate having electrode instead of a glass plate has been proposed for displays (e.g., liquid crystal display and electroluminescence (EL) display) in order to implement a reduction in thickness, a reduction in weight, an increase in flexibility, and the like. However, since such a plastic film easily allows water vapor, oxygen, and the like to pass through as compared with a glass plate, elements provided in a display may deteriorate.

In order to solve this problem, Patent Document 1 discloses a gas barrier film in which a gas barrier inorganic compound thin film is stacked on a polyester resin film.

However, the gas barrier film disclosed in Patent Document 1 has the following problems.
(i) The gas barrier capability of the gas barrier film is not satisfactory for practical applications.
(ii) A pinhole is easily formed in a layer formed on the gas barrier layer (inorganic compound thin film) due to insufficient surface flatness, and the gas barrier capability may significantly decrease in an area in which a pinhole is formed.
(iii) Since the film is formed by stacking a gas barrier layer formed of an inorganic compound on a base film formed of a polyester resin by a deposition method, an electron beam method, a sputtering method, or the like, the gas barrier capability may deteriorate by occurrence of cracks in the gas barrier layer when the laminate film is rounded or folded.

A method that alternately stacks inorganic films and organic films has been proposed in order to improve the bendability. However, this method results in a complex process, a decrease in adhesion, an increase in material cost, and the like.

RELATED-ART DOCUMENT

Patent Document

Patent Document 1: JP-A-10-305542

SUMMARY OF THE INVENTION

Problems to be Solved by the Invention

The present invention was conceived in view of the above situation. An object of the invention is to provide a formed article that exhibits an excellent gas barrier capability, excellent bendability, excellent adhesion, and excellent surface flatness, a method of producing the same, an electronic device member that includes the formed article, and an electronic device that includes the electronic device member.

Means for Solving the Problems

The inventors conducted extensive studies in order to achieve the above object. As a result, the inventors found that a formed article that includes a gas barrier layer that is formed of a material including at least an oxygen atom, a carbon atom, and a silicon atom, the gas barrier layer including an area (A) where an oxygen atom content rate gradually decreases, and a carbon atom content rate gradually increases from a surface in a depth direction, the area (A) including at least two partial areas having a specific oxygen atom content rate, a specific carbon atom content rate, and a specific silicon atom content rate, exhibits an excellent gas barrier capability, excellent bendability, excellent adhesion, and excellent surface flatness.

The inventors also found that the above formed article can be easily and efficiently formed by implanting ions into a polysilane compound-containing layer of a formed body that includes the polysilane compound-containing layer in its surface. These findings have led to the completion of the invention.

A first aspect of the invention provides the following formed article (see (1) to (7)).
(1) A formed article including a gas barrier layer that is formed of a material including at least an oxygen atom, a carbon atom, and a silicon atom, the gas barrier layer including an area (A) where an oxygen atom content rate gradually decreases, and a carbon atom content rate gradually increases in a depth direction from a surface, the area (A) including a partial area (A1) and a partial area (A2), the partial area (A1) having an oxygen atom content rate of 20 to 55%, a carbon atom content rate of 25 to 70%, and a silicon atom content rate of 5 to 20% based on the total content rate of oxygen atoms, carbon atoms, and silicon atoms, and the partial area (A2) having an oxygen atom content rate of 1 to 15%, a carbon atom content rate of 72 to 87%, and a silicon atom content rate of 7 to 18% based on the total content rate of oxygen atoms, carbon atoms, and silicon atoms.
(2) The formed article according to (1), wherein the area (A) is formed in a surface layer part of a polysilane compound-containing layer.
(3) A formed article including a gas barrier layer obtained by implanting ions into a polysilane compound-containing layer.
(4) The formed article according to (2) or (3), wherein the polysilane compound includes a repeating unit shown by a formula (1),

[Chemical Formula 1]

wherein $R^1$ and $R^2$ individually represent a hydrogen atom, an alkyl group, an alkenyl group, a cycloalkyl group, a cycloalkenyl group, an aryl group, a hydroxyl group, an alkoxy group, a cycloalkyloxy group, an aryloxy group, an aralkyloxy group, a substituted or unsubstituted amino group, a silyl group, or a halogen atom, provided that $R^1$ and $R^2$ may respectively be either the same or different.

(5) The formed article according to (3) or (4), wherein the gas barrier layer is obtained by implanting ions into the polysilane compound-containing layer by a plasma ion implantation method.

(6) The formed article according to (3), wherein the ions are obtained by ionizing at least one gas selected from the group consisting of hydrogen, nitrogen, oxygen, argon, helium, neon, xenon, krypton, a silicon compound, and a hydrocarbon.

(7) The formed article according to (1) or (3), the formed article having a water vapor transmission rate at a temperature of 40° C. and a relative humidity of 90% of less than 0.5 g/m²/day.

A second aspect of the invention provides the following method of producing a formed article (see (8) to (10)).

(8) A method of producing the formed article according to (3), the method including implanting ions into a polysilane compound-containing layer of a formed body that includes the polysilane compound-containing layer in its surface.

(9) The method according to (8), wherein the ions are obtained by ionizing at least one gas selected from the group consisting of hydrogen, nitrogen, oxygen, argon, helium, neon, xenon, krypton, a silicon compound, and a hydrocarbon.

(10) The method according to (8), including implanting ions into a polysilane compound-containing layer while feeding a long formed body that includes the polysilane compound-containing layer in its surface in a given direction.

A third aspect of the invention provides the following electronic device member (see (11)).

(11) An electronic device member including the formed article according to any one of (1) to (7).

A fourth aspect of the invention provides the following electronic device (see (12)).

(12) An electronic device including the electronic device member according to (11).

Effects of the Invention

The formed article according to the first aspect of the present invention exhibits an excellent gas barrier capability, excellent bendability, excellent surface flatness, and high adhesion. Therefore, the formed article may suitably be used as an electronic device member (e.g., solar battery backsheet) for flexible displays, solar batteries, and the like.

The method of producing a formed article according to the second aspect of the present invention can easily and efficiently produce the formed article according to the first aspect of the invention that exhibits an excellent gas barrier capability. Moreover, an increase in area can be easily achieved at low cost as compared with a method that deposits an inorganic film.

Since the electronic device member according to the third aspect of the present invention exhibits an excellent gas barrier capability, excellent bendability, and the like, the electronic device member may suitably be used for electronic devices such as displays and solar batteries.

DESCRIPTION OF EXEMPLARY EMBODIMENTS

Figure 1:
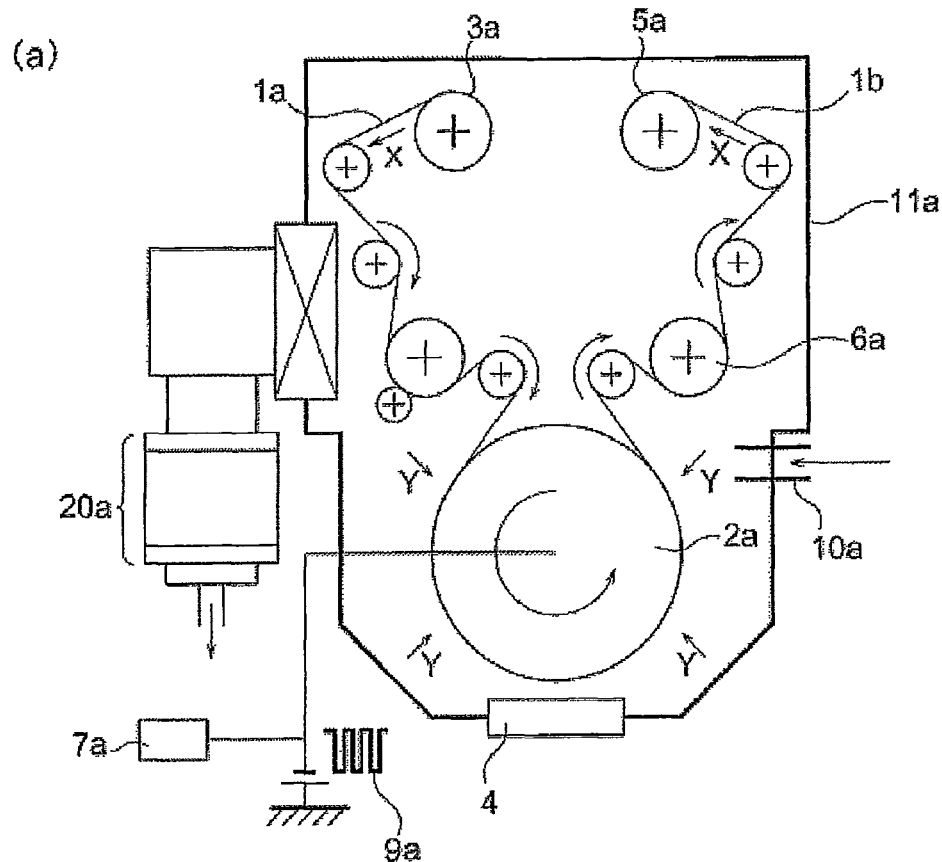
FIG. 1 is a view showing a schematic configuration of a plasma ion implantation apparatus used in the present invention.
Figure 1:
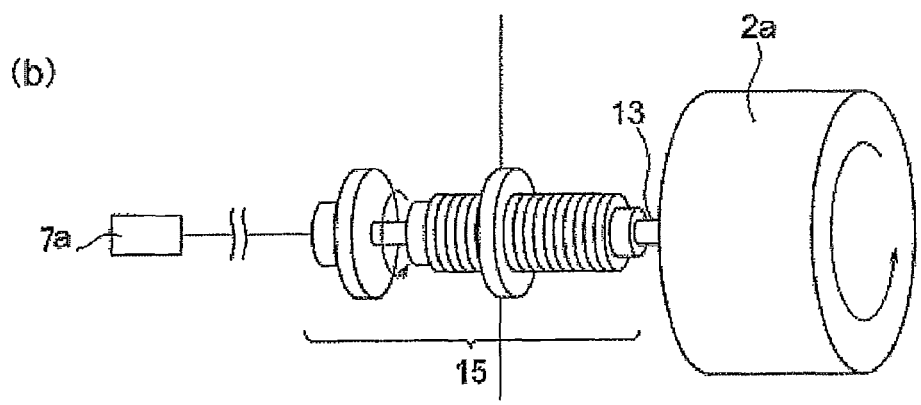

A formed article, a method of producing a formed article, an electronic device member, and an electronic device according to embodiments of the invention are described in detail below.

1) Formed Article

A formed article according to one embodiment of the invention includes a gas barrier layer that is formed of a material including at least an oxygen atom, a carbon atom, and a silicon atom, the gas barrier layer including an area (A) where an oxygen atom content rate gradually decreases, and a carbon atom content rate gradually increases in a depth direction from a surface, the area (A) including at least two partial areas having a specific oxygen atom content rate, a specific carbon atom content rate, and a specific silicon atom content rate.

The formed article that includes such a gas barrier layer exhibits an excellent gas barrier capability, excellent bendability, excellent adhesion, and excellent surface flatness.

The formed article according to one embodiment of the invention includes the gas barrier layer that is formed of a material including at least an oxygen atom, a carbon atom, and a silicon atom.

The gas barrier layer is formed of a material that includes an oxygen atom, a carbon atom, and a silicon atom, and includes an area (A) where an oxygen atom content rate gradually decreases, and a carbon atom content rate gradually increases in the depth direction from the surface.

Note that the term "surface" used herein includes the surface of the gas barrier layer when the gas barrier layer forms the outermost surface of the formed article, and the boundary between the gas barrier layer and another layer that is formed on the gas barrier layer.

The gas barrier layer may include only the area (A), or may include the area (A) as part (preferably the surface layer part) of the gas barrier layer. It is preferable that the gas barrier layer include the area (A) as part of the gas barrier layer from the viewpoint of ease of production.

The thickness of the area (A) is normally 5 to 100 nm, and preferably 10 to 50 nm.

In the formed article according to one embodiment of the invention, the area (A) includes a partial area (A1) and a partial area (A2), the partial area (A1) having an oxygen atom content rate of 20 to 55%, a carbon atom content rate of 25 to 70%, and a silicon atom content rate of 5 to 20% based on the total content rate of oxygen atoms, carbon atoms, and silicon atoms, and the partial area (A2) having an oxygen atom content rate of 1 to 15%, a carbon atom content rate of 72 to 87%, and a silicon atom content rate of 7 to 18% based on the total content rate of oxygen atoms, carbon atoms, and silicon atoms.

The oxygen atom content rate, the carbon atom content rate, and the silicon atom content rate are measured by the method described later in the examples.

The layer (gas barrier layer) that includes the area (A) including the partial area (A1) and the partial area (A2) exhibits an excellent gas barrier capability.

The partial area (A1) has the lowest carbon atom content rate and the highest oxygen atom content rate in the area (A), and has an oxygen atom content rate of 20 to 55%, a carbon atom content rate of 25 to 70%, and a silicon atom content rate of 5 to 20% based on the total content rate of oxygen atoms, carbon atoms, and silicon atoms. The partial area (A1) is normally positioned in the surface of the gas barrier layer. The thickness of the area (A1) is normally 1 to 10 nm.

The partial area (A2) has an oxygen atom content rate of 1 to 15%, a carbon atom content rate of 72 to 87%, and a silicon atom content rate of 7 to 18% based on the total content rate of oxygen atoms, carbon atoms, and silicon atoms. The partial area (A2) is normally positioned adjacent to the partial area (A1) in the depth direction of the partial area (A1).

The thickness of the area (A2) is normally 5 to 100 nm. The area (A) includes the partial area (A1) and the partial area (A2). The area (A) is configured so that the oxygen atom content rate gradually decreases within the above range, and the carbon atom content rate gradually increases within the above range in the depth direction from the surface.

The gas barrier layer included in the formed article according to one embodiment of the invention may be a polysilane compound-containing layer in which the area (A) is formed in the surface layer part. More specifically, the gas barrier layer may be a layer obtained by implanting ions into a polysilane compound-containing layer (hereinafter may be referred to as "implanted layer"), (described later) or a layer obtained by subjecting a polysilane compound-containing layer to a plasma treatment.

It is preferable that the area (A) be formed in a surface layer part of a polysilane compound-containing layer, and more preferably a layer obtained by implanting ions into a surface layer part of a polysilane compound-containing layer.

It is preferable that the polysilane compound include at least one repeating unit selected from structural units shown by the following formula (1).

The formed article according to one embodiment of the invention may includes a gas barrier layer obtained by implanting ions into a polysilane compound-containing layer (hereinafter may be referred to as "ion-implanted layer").

The polysilane compound used in connection with the invention is a polymer compound that includes a repeating unit including an —Si—Si— bond in the molecule. Examples of the polysilane compound include a compound that includes at least one repeating unit selected from structural units shown by the following formula (1).

[Chemical Formula 2]

(1)

wherein $R^1$ and $R^2$ individually represent a hydrogen atom, an alkyl group, an alkenyl group, a cycloalkyl group, a cycloalkenyl group, an aryl group, a hydroxyl group, an alkoxy group, a cycloalkyloxy group, an aryloxy group, an aralkyloxy group, a substituted or unsubstituted amino group, a silyl group, or a halogen atom, provided that $R^1$ and $R^2$ may respectively be either the same or different.

Examples of the alkyl group represented by $R^1$ and $R^2$ include alkyl groups having 1 to 10 carbon atoms such as a methyl group, an ethyl group, an n-propyl group, an isopropyl group, an n-butyl group, a s-butyl group, a t-butyl group, an n-pentyl group, and an n-hexyl group.

Examples of the alkenyl group include alkenyl groups having 2 to 10 carbon atoms such as a vinyl group, an allyl group, a butenyl group, and a pentenyl group.

Examples of the cycloalkyl group include cycloalkyl groups having 3 to 10 carbon atoms such as a cyclopentyl group, a cyclohexyl group, and a cyclooctyl group.

Examples of the cycloalkenyl group include cycloalkenyl groups having 4 to 10 carbon atoms such as a cyclopentenyl group and a cyclohexenyl group.

Examples of the aryl group include aryl groups having 6 to 20 carbon atoms such as a phenyl group, an α-naphthyl group, and a β-naphthyl group.

Examples of the alkoxy group include alkoxy groups having 1 to 10 carbon atoms such as a methoxy group, an ethoxy group, a propoxy group, an isopropoxy group, a butoxy group, a t-butoxy group, and a pentyloxy group.

Examples of the cycloalkyloxy group include cycloalkyloxy groups having 3 to 10 carbon atoms such as a cyclopenthyloxy group and a cyclohexyloxy group.

Examples of the aryloxy group include aryloxy groups having 6 to 20 carbon atoms such as a phenoxy group, a 1-naphthyloxy group, and a 2-naphthyloxy group.

Examples of the aralkyloxy group include aralkyloxy groups having 7 to 20 carbon atoms such as a benzyloxy group, a phenethyloxy group, and a phenylpropyloxy group.

Examples of the substituted or unsubstituted amino group include an amino group; N-mono-substituted or N,N-disubstituted amino groups substituted with an alkyl group having 1 to 10 carbon atoms, a cycloalkyl group having 3 to 10 carbon atoms, an aryl group, an aralkyl group, an acyl group, or the like; and the like.

Examples of the silyl group include $Si_{1-10}$ silanyl groups (preferably $Si_{1-6}$ silanyl groups) such as a silyl group, a disilanyl group, and a trisilanyl group, substituted silyl groups (e.g., a substituted silyl group substituted with an alkyl group, a cycloalkyl group, an aryl group, an aralkyl group, an alkoxy group, or the like), and the like.

Examples of the halogen atom include a fluorine atom, a chlorine atom, a bromine atom, an iodine atom, and the like.

When $R^1$ and $R^2$ represent an alkyl group or an alkenyl group, the alkyl group may include a substituent, such as a substituted or unsubstituted aryl group (e.g., phenyl group or 4-methylphenyl group), an alkoxy group (e.g., methoxy group or ethoxy group), an aryloxy group (e.g., phenoxy group), a halogen atom (e.g., fluorine atom or chlorine atom), a nitro group, or a cyano group, at an arbitrary position.

When $R^1$ and $R^2$ represent a cycloalkyl group, a cycloalkenyl group, an aryl group, an alkoxy group, a cycloalkyloxy group, an aryloxy group, or an aralkyloxy group, these groups may include a substituent, such as an alkyl group (e.g., methyl group or ethyl group), a substituted or unsubstituted aryl group (e.g., phenyl group or 4-methylphenyl group), an alkoxy group (e.g., methoxy group or ethoxy group), an aryloxy group (e.g., phenoxy group), a halogen atom (e.g., fluorine atom or chlorine atom), a nitro group, or a cyano group, at an arbitrary position.

It is preferable to use a polysilane compound that includes a repeating unit shown by the formula (1) wherein $R^1$ and $R^2$ individually represent a hydrogen atom, an alkyl group, an aryl group, a hydroxyl group, an alkoxy group, an amino group, or a silyl group. It is more preferable to use a polysilane compound that includes a repeating unit shown by the formula (1) wherein $R^1$ and $R^2$ individually represent a hydrogen atom, an alkyl group, or an aryl group. It is particularly preferable to use a polysilane compound that includes a repeating unit shown by the formula (1) wherein $R^1$ and $R^2$ individually represent an alkyl group having 1 to 4 carbon atoms or an aryl group.

The configuration of the polysilane compound is not particularly limited. The polysilane compound may be a noncyclic polysilane (linear polysilane, branched polysilane, or network polysilane), or a homopolymer or a copolymer (e.g., random copolymer, block copolymer, alternating copolymer, or comb copolymer) of a cyclic polysilane or the like.

When the polysilane compound is a noncyclic polysilane, the end group (end substituent) of the polysilane compound may be a hydrogen atom, a halogen atom (e.g., chlorine atom), an alkyl group, a hydroxyl group, an alkoxy group, a silyl group, or the like.

Specific examples of the polysilane compound include homopolymers such as a polydialkylsilane such as polydimethylsilane, poly(methylpropylsilane), poly(methylbutylsilane), poly(methylpentylsilane), poly(dibutylsilane), and poly(dihexylsilane), a polydiarylsilane such as poly(diphenylsilane), and a poly(alkylarylsilane) such as poly(methylphenylsilane); copolymers such as a copolymer of a dialkylsilane and another dialkylsilane such as a dimethylsilane-methylhexylsilane copolymer, an arylsilane-alkylarylsilane copolymer such as a phenylsilane-methylphenylsilane copolymer, and a dialkylsilane-alkylarylsilane copolymer such as a dimethylsilane-methylphenylsilane copolymer, a dimethylsilane-phenylhexylsilane copolymer, a dimethylsilane-methylnaphthylsilane copolymer, and a methylpropylsilane-methylphenylsilane copolymer; and the like.

These polysilane compounds may be used either individually or in combination.

The details of the polysilane compound are disclosed in R. D. Miller, J. Michl; Chemical Review, Vol. 89, p. 1359 (1989), N. Matsumoto; Japanese Journal of Physics, Vol. 37, p. 5425 (1998), and the like. The polysilane compounds disclosed in the above documents may be used in the invention.

The weight average molecular weight of the polysilane compound is not particularly limited, but is preferably 300 to 100,000, more preferably 400 to 50,000, and still more preferably 500 to 30,000.

A number of polysilane compounds are known in the art, and may be produced by a known method. For example, the polysilane compound may be produced by a method that subjects a halosilane to dehalogenation/polycondensation using magnesium as a reducing agent ("magnesium reduction method", WO98/29476, for example), a method that subjects a halosilane to dehalogenation/polycondensation in the presence of an alkali metal ("Kipping method", J. Am. Chem. Soc., 110, 124 (1988), Macromolecules, 23, 3423 (1990), for example), a method that subjects a halosilane to dehalogenation/polycondensation by electrode reduction (J. Chem. Soc., Chem. Commun., 1161 (1990), J. Chem. Soc., Chem. Commun 897 (1992), for example), a method that subjects a hydrosilane to dehydrogenation/condensation in the presence of a specific polymerization metal catalyst (JP-A-4-334551, for example), a method that subjects a disilene crosslinked using a biphenyl or the like to anionic polymerization (Macromolecules, 23, 4494 (1990), for example), a method that subjects a cyclic silane to ring-opening polymerization, or the like.

The polysilane compound-containing layer may include an additional component other than the polysilane compound as long as the object of the invention is not impaired.

Examples of the additional component include a curing agent, another polymer, an aging preventive, a light stabilizer, a flame retardant, and the like.

The content of the polysilane compound in the polysilane compound-containing layer is preferably 50 wt % or more, and more preferably 70 wt % or more, from the viewpoint of obtaining an ion-implanted layer that exhibits an excellent gas barrier capability.

The polysilane compound-containing layer may be formed by an arbitrary method. For example, the polysilane compound-containing layer may be formed by applying a solution that includes at least one polysilane compound, an optional component, a solvent, and the like to an appropriate base, and drying the resulting film.

A spin coater, a knife coater, a gravure coater, or the like may be used as the coater.

It is preferable to heat the film when drying the film in order to improve the gas barrier capability of the resulting formed article. In this case, the film is heated at 80 to 150° C. for several tens of seconds to several tens of minutes.

The thickness of the polysilane compound-containing layer is not particularly limited, but is normally 20 to 1000 nm, preferably 30 to 500 nm, and more preferably 40 to 200 nm.

According to the invention, a formed article that exhibits a sufficient gas barrier capability can be obtained even if the thickness of the polysilane compound-containing layer is of the order of nanometers.

The ion-implanted layer included in the formed article according to one embodiment of the invention is not particularly limited as long as the ion-implanted layer is a layer which includes at least one polysilane compound and into which ions are implanted.

The ion-implanted layer is obtained by implanting ions into the polysilane compound-containing layer.

The dose may be appropriately determined depending on the application (usage) of the resulting formed article (e.g., gas barrier capability and bendability required for the application), and the like.

Examples of ions implanted into the polysilane compound-containing layer include ions of a rare gas such as argon, helium, neon, krypton, or xenon; ions of a fluorocarbon, hydrogen, nitrogen, oxygen, carbon dioxide, chlorine, fluorine, sulfur, or the like;

ions of an alkane gas such as methane, ethane, propane, butane, pentane, or hexane; ions of an alkene gas such as ethylene, propylene, butene, or pentene; ions of an alkadiene gas such as pentadiene or butadiene; ions of an alkyne gas such as acetylene or methylacetylene; ions of an aromatic hydrocarbon gas such as benzene, toluene, xylene, indene, naphthalene, or phenanthrene; ions of a cycloalkane gas such as cyclopropane or cyclohexane; ions of a cycloalkene gas such as cyclopentene or cyclohexene (i.e., ions of a hydrocarbon);

ions of a metal such as gold, silver, copper, platinum, nickel, palladium, chromium, titanium, molybdenum, niobium, tantalum, tungsten, or aluminum;

ions of a silicon compound such as silane ($SiH_4$) or an organosilicon compound; and the like.

Examples of the organosilicon compound include tetraalkoxysilanes such as tetramethoxysilane, tetraethoxysilane, tetra-n-propoxysilane, tetraisopropoxysilane, tetra-n-butoxysilane, and tetra-t-butoxysilane;

substituted or unsubstituted alkylalkoxysilanes such as dimethyldimethoxysilane, dimethyldiethoxysilane, diethyldimethoxysilane, methyltriethoxysilane, ethyltrimethoxysilane, and (3,3,3-trifluoropropyl)trimethoxysilane;

arylalkoxysilanes such as diphenyldimethoxysilane and phenyltriethoxysilane;

disiloxanes such as hexamethyldisiloxane (HMDSO);

aminosilanes such as bis(dimethylamino)dimethylsilane, bis(dimethylamino)methylvinylsilane, bis(ethylamino)dimethylsilane, diethylaminotrimethylsilane, dimethylaminodimethylsilane, tetrakisdimethylaminosilane, and tris(dimethylamino)silane;

silazanes such as hexamethyldisilazane, hexamethylcyclotrisilazane, heptamethyldisilazane, nonamethyltrisilazane, octamethylcyclotetrasilazane, and tetramethyldisilazane;

isocyanatosilanes such as tetraisocyanatosilane;

halogenosilanes such as triethoxyfluorosilane;

alkenylsilanes such as diallyldimethylsilane and allyltrimethylsilane;

substituted or unsubstituted alkylsilanes such as di-t-butylsilane, 1,3-disilabutane, bis(trimethylsilyl)methane, trimethylsilane, tetramethylsilane, tris(trimethylsilyl)methane, tris(trimethylsilyl)silane, and benzyltrimethylsilane;

silylalkynes such as bis(trimethylsilyl)acetylene, trimethylsilylacetylene, and 1-(trimethylsilyl)-1-propyne;

silylalkenes such as 1,4-bistrimethylsilyl-1,3-butadiyne and cyclopentadienyltrimethylsilane;

arylalkylsilanes such as phenyldimethylsilane and phenyltrimethylsilane;

alkynylalkylsilanes such as prop argyltrimethylsilane;

alkenylalkylsilanes such as vinyltrimethylsilane;

disilanes such as hexamethyldisilane;

siloxanes such as octamethylcyclotetrasiloxane, tetramethylcyclotetrasiloxane, and hexamethylcyclotetrasiloxane;

N,O-bis(trimethylsilyl)acetamide;

bis(trimethylsilyl)carbodiimide; and the like.

The above ions may be used either individually or in combination.

Among these, at least one ion selected from the group consisting of ions of hydrogen, nitrogen, oxygen, argon, helium, neon, xenon, krypton, a silicon compound, and a hydrocarbon is preferable more preferably at least one ion selected from the group consisting of hydrogen, nitrogen, oxygen, argon, helium, neon, xenon, and krypton due to ease of implantation and a capability to form an ion-implanted layer that exhibits an excellent gas barrier capability and excellent bendability.

The ion implantation method is not particularly limited. For example, a method that includes forming a polysilane compound-containing layer, and implanting ions into the polysilane compound-containing layer may be used. More specifically, ions may be implanted by applying ions (ion beams) accelerated by an electric field, implanting ions present in plasma (plasma ion implantation method), or the like. It is preferable to use the plasma ion implantation method since a formed article that exhibits a gas barrier capability can be easily and efficiently obtained.

The plasma ion implantation method is implemented by generating plasma in an atmosphere containing a plasma-generating gas, and implanting ions (cations) in the plasma into the polysilane compound-containing layer by applying a negative high-voltage pulse to the polysilane compound-containing layer to form an ion-implanted layer, for example.

The thickness of the ion-implanted layer may be controlled depending on the implantation conditions (e.g., type of ion, applied voltage, and implantation time), and may be determined depending on the thickness of the polysilane compound-containing layer, the intended application of the formed article, and the like. The thickness of the ion-implanted layer is normally 10 to 1000 nm.

Whether or not an ion-implanted layer has been formed may be determined by performing elemental analysis in an area having a depth of up to about 10 nm from the surface of the layer by X-ray photoelectron spectroscopy (XPS).

The shape of the formed article according to one embodiment of the invention is not particularly limited. For example, the formed article may be in the shape of a film, a sheet, a rectangular parallelepiped, a polygonal prism, a tube, or the like. When using the formed article as an electronic device member (described later), the formed article is preferably in the shape of a film or a sheet. The thickness of the film may be appropriately determined depending on the desired application of the electronic device.

The formed article according to one embodiment of the invention may include only the gas barrier layer, or may also include an additional layer other than the gas barrier layer. The additional layer may be a single layer, or may include a plurality of identical or different layers.

Examples of the additional layer include a base, an inorganic thin film layer, a conductor layer, an impact-absorbing layer, a primer layer, and the like that are formed of a material other than the polysilane compound.

The material for the base is not particularly limited as long as the application of the formed article is not hindered. Examples of the material for the base include polyimides, polyamides, polyamideimides, polyphenylene ethers, polyether ketones, polyether ether ketones, polyolefins, polyesters, polycarbonates, polysulfones, polyether sulfones, polyphenylene sulfides, polyallylates, acrylic resins, cycloolefin polymers, aromatic polymers, and the like.

Among these, polyesters, polyamides, or cycloolefin polymers are preferable due to versatility. It is more preferable to use polyesters.

Examples of polyesters include polyethylene terephthalate, polybuthylene terephthalate, polyethylene naphthalate, polyallylate, and the like.

Examples of polyamides include wholly aromatic polyamides, nylon 6, nylon 66, nylon copolymers, and the like.

Examples of cycloolefin polymers include norbornene polymers, monocyclic olefin polymers, cyclic conjugated diene polymers, vinyl alicyclic hydrocarbon polymers, and hydrogenated products thereof. Specific examples of cycloolefin polymers include APEL (ethylene-cycloolefin copolymer manufactured by Mitsui Chemicals Inc.), ARTON (norbornene polymer manufactured by JSR Corporation), ZEONOR (norbornene polymer manufactured by Zeon Corporation), and the like.

The thickness of the base is not particularly limited, but is normally 5 to 1000 µm, and preferably 10 to 300 µm.

The inorganic thin film layer includes one or more inorganic compounds. Examples of the inorganic compounds include inorganic compounds that can be deposited under vacuum, and exhibit a gas barrier capability, such as inorganic oxides, inorganic nitrides, inorganic carbides, inorganic sulfides, and composites thereof (e.g., inorganic oxynitride, inorganic oxycarbide, inorganic carbonitride, and inorganic oxycarbonitride).

The thickness of the inorganic thin film layer is normally 10 to 1000 nm, preferably 20 to 500 nm, and more preferably 20 to 100 nm.

Examples of the material used for the conductor layer include a metal, an alloy, a metal oxide, an electrically conductive compound, a mixture thereof, and the like. Specific examples of the material used for the conductor layer include semiconductive metal oxides such as antimony-doped tin oxide (ATO), fluorine-doped tin oxide (FTO), tin oxide, zinc oxide, indium oxide, indium tin oxide (ITO), and indium zinc oxide (IZO); metals such as gold, silver, chromium, and nickel; a mixture of a metal and a conductive metallic oxide; inorganic conductive substances such as copper iodide and copper sulfide; organic conductive materials such as polyaniline, polythiophene, and polypyrrole; and the like.

The conductor layer may be formed by an arbitrary method. For example, the conductor layer may be formed by deposition, sputtering, ion plating, thermal CVD, plasma CVD, or the like.

The thickness of the conductor layer may be appropriately selected depending on the application and the like. The thickness of the conductor layer is normally 10 nm to 50 µm, and preferably 20 nm to 20 µm.

The impact-absorbing layer prevents occurrence of cracks when an impact is applied to the inorganic thin film layer. The material used for the impact-absorbing layer is not particularly limited. Examples of the material used for the impact-absorbing layer include acrylic resins, urethane resins, silicone resins, olefin resins, rubber materials, and the like.

A product commercially available as a pressure-sensitive adhesive, a coating agent, a sealing material, or the like may also be used as the material for the impact-absorbing layer. It is preferable to use a pressure-sensitive adhesive (e.g., acrylic pressure-sensitive adhesive, silicone pressure-sensitive adhesive, or rubber pressure-sensitive adhesive).

The impact-absorbing layer may be formed by an arbitrary method. For example, the impact-absorbing layer may be formed by applying a solution that includes the material (e.g., pressure-sensitive adhesive) for the impact-absorbing layer and an optional component (e.g., solvent) to the layer on which the impact-absorbing layer is to be formed, drying the resulting film, and optionally heating the dried film in the same manner as in the case of forming the polysilane compound-containing layer.

Alternatively, the impact-absorbing layer may be formed on a release base, and transferred to a layer on which the impact-absorbing layer is to be formed.

The thickness of the impact-absorbing layer is normally 1 to 100 µm, and preferably 5 to 50 µm.

The primer layer improves the interlayer adhesion between the base and the gas barrier layer. A formed article that exhibits excellent interlayer adhesion and surface flatness can be obtained by providing the primer layer.

An arbitrary material may be used to form the primer layer. Examples of the material that may be used to form the primer layer include silicon-containing compounds; a photopolymerizable composition that includes a photopolymerizable compound formed of a photopolymerizable monomer and/or a photopolymerizable prepolymer, and an initiator that generates radicals at least due to visible light; resins such as a polyester resin, a polyurethane resin (particularly a two-component curable resin that includes an isocyanate compound and a polyacryl polyol, a polyester polyol, a polyether polyol, or the like), an acrylic resin, a polycarbonate resin, a vinyl chloride/vinyl acetate copolymer, a polyvinyl butyral resin, and a nitrocellulose resin; alkyl titanates; ethyleneimine; and the like. These materials may be used either individually or in combination.

The primer layer may be formed by dissolving or dispersing the material used to form the primer layer in an appropriate solvent to prepare a primer layer-forming solution, applying the primer layer-forming solution to one side or each side of the base, drying the resulting film, and optionally heating the dried film.

The primer layer-forming solution may be applied to the base by a wet coating method. Examples of the wet coating method include dipping, roll coating, gravure coating, knife coating, air knife coating, roll knife coating, die coating, screen printing, spray coating, a gravure offset method, and the like.

The film formed using the primer layer-forming solution may be dried by hot-blast drying, heat roll drying, infrared irradiation, or the like. The thickness of the primer layer is normally 10 to 1000 nm.

Ions may be implanted into the primer layer in the same manner as in the case of implanting ions into the ion implantation target layer (described later). A formed article that exhibits a more excellent gas barrier capability can be obtained by implanting ions into the primer layer.

When the formed article according to one embodiment of the invention is a laminate that includes the additional layer, the gas barrier layer may be situated at an arbitrary position. The number of gas barrier layers may be one or more.

The formed article according to one embodiment of the invention exhibits an excellent gas barrier capability. When the formed article has a film-shape or sheet-shape (hereinafter referred to as "film-shape"), it is preferable that the formed article exhibit excellent bendability, and maintain the gas barrier capability when the formed article is folded.

The formed article according to one embodiment of the invention exhibits an excellent gas barrier capability since the formed article has a low gas (e.g., water vapor) transmission rate. The water vapor transmission rate of the formed article at a temperature of 40° C. and a relative humidity of 90% is normally less than 0.50 g/m$^2$/day, and preferably 0.35 g/m$^2$/day or less.

The gas (e.g., water vapor) transmission rate of the formed article may be measured using a known gas transmission rate measuring apparatus.

Whether or not the formed article according to one embodiment of the invention exhibits excellent bendability, and maintains the gas barrier capability when the formed article is folded may be determined by folding the film-shaped formed article, applying a pressure to the film-shaped formed article, and determining whether or not the water vapor transmission rate has decreased to a large extent after unfolding the formed article. The film-shaped formed article according to one embodiment of the invention advantageously maintains the gas barrier capability as compared with an inorganic film having an identical thickness even when the formed article has been folded.

The formed article according to one embodiment of the invention also exhibits excellent surface flatness. Whether or not the formed article according to one embodiment of the invention exhibits excellent surface flatness may be determined by measuring the surface roughness Ra (nm) (measurement area: 1×1 μm) of the formed article using an atomic force microscope (AFM). The surface roughness Ra (measurement area: 1×1 μm) of the formed article is preferably 0.45 nm or less, and more preferably 0.40 nm or less.

2) Method of Producing Formed Article

A method of producing a formed article according to one embodiment of the invention includes implanting ions into a polysilane compound-containing layer of a formed body that includes the polysilane compound-containing layer in its surface.

In the method of producing a formed article according to one embodiment of the invention, it is preferable that the ions be obtained by ionizing at least one gas selected from the group consisting of hydrogen, nitrogen, oxygen, argon, helium, neon, xenon, krypton, a silicon compound, and a hydrocarbon.

The method of producing a formed article according to one embodiment of the invention preferably includes implanting ions into a polysilane compound-containing layer while feeding a long formed body that includes the polysilane compound-containing layer in its surface in a given direction.

According to this method, ions can be implanted into a long formed body wound around a feed-out roll while feeding the formed body in a given direction, which can then be wound around a wind-up roll, for example. Therefore, an ion-implanted formed article can be continuously produced.

The long formed body is in the shape of a film. The formed body may include only the polysilane compound-containing layer, or may also include an additional layer other than the polysilane compound-containing layer. Examples of the additional layer include the above base and the like formed of a material other than the polysilane compound.

The thickness of the formed body is preferably 1 to 500 μm, and more preferably 5 to 300 μm, from the viewpoint of operability of winding/unwinding and feeding.

Ions may be implanted into the polysilane compound-containing layer by an arbitrary method. It is preferable to form an ion-implanted layer in the surface of the polysilane compound-containing layer by a plasma ion implantation method.

The plasma ion implantation method includes implanting ions present in plasma into the surface of the polysilane compound-containing layer by applying a negative high-voltage pulse to the formed body that includes the polysilane compound-containing layer in its surface exposed to plasma.

As the plasma ion implantation method, it is preferable to use (A) a method that implants ions present in plasma generated by utilizing an external electric field into the surface of the polysilane compound-containing layer, or (B) a method that implants ions present in plasma generated due to only an electric field produced by applying a negative high-voltage pulse without an external electric field to the polysilane compound-containing layer into the surface of the polysilane compound-containing layer.

When using the method (A), it is preferable to set the ion implantation pressure (plasma ion implantation pressure) to 0.01 to 1 Pa. If the plasma ion implantation pressure is within the above range, a uniform ion-implanted layer can be formed conveniently and efficiently. This makes it possible to efficiently form an ion-implanted layer that exhibits bendability and a gas barrier capability.

The method (B) does not require increasing the degree of decompression, allows an easy operation, and significantly reduces the processing time. Moreover, the entire polysilane compound-containing layer can be uniformly processed, and ions present in plasma can be continuously implanted into the surface of the polysilane compound-containing layer with high energy when applying a negative high-voltage pulse. The method (B) also has an advantage in that an excellent ion-implanted layer can be uniformly formed in the surface of the polysilane compound-containing layer by merely applying a negative high-voltage pulse to the polysilane compound-containing layer without requiring a special means such as a high-frequency electric power supply (e.g., radio frequency (RF) power supply or microwave power supply).

In using the method either (A) or (B), the pulse width when applying a negative high-voltage pulse (i.e., during ion implantation) is preferably 1 to 15 μsec. If the pulse width is within the above range, a uniform ion-implanted layer can be formed more conveniently and efficiently.

The voltage applied when generating plasma is preferably −1 to −50 kV, more preferably −1 to −30 kV, and particularly preferably −5 to −20 kV. If the applied voltage is higher than −1 kV, the dose may be insufficient, so that the desired performance may not be obtained. If the applied voltage is lower than −50 kV, the formed article may be charged during ion implantation, or the formed article may be colored, it is unfavorable.

Examples of the ion species to be plasma-implanted include the implantation target ions mentioned above.

A plasma ion implantation apparatus is used when implanting ions present in the plasma into the surface of the polysilane compound-containing layer.

Specific examples of the plasma ion implantation apparatus include (a) an apparatus that causes the polysilane compound-containing layer (hereinafter may be referred to as "ion implantation target layer") to be evenly enclosed by plasma by superimposing high-frequency electric power on a feed-through that applies a negative high-voltage pulse to the ion implantation target layer so that ions present in plasma are attracted, implanted, collide, and deposited (JP-A-2001-26887), (β) an apparatus that includes an antenna in a chamber, wherein high-frequency electric power is applied to generate plasma, positive and negative pulses are alternately applied to the ion implantation target layer after plasma has reached an area around the ion implantation target layer, so that ions present in plasma are attracted and implanted by heating the ion implantation target layer by causing electrons present in plasma to be attracted and collide due to the positive pulse, and applying the negative pulse while controlling the temperature by controlling the pulse factor (JP-A-2001-156013), (γ) a plasma ion implantation apparatus that generates plasma using an external electric field utilizing a high-frequency power supply such as a microwave power supply, and causes ions present in plasma to be attracted and implanted by applying a high-voltage pulse, (δ) a plasma ion implantation apparatus that implants ions present in plasma generated due to an electric field produced by applying a high-voltage pulse without using an external electric field, and the like.

It is preferable to use the plasma ion implantation apparatus (γ) or (δ) since the plasma ion implantation apparatus (γ) or (δ) allows a convenient operation, significantly reduces the processing time, and can be continuously used.

A method using the plasma ion implantation apparatus (γ) or (δ) is described in detail below with reference to the drawings.

FIG. 1 is a view schematically showing a continuous plasma ion implantation apparatus that includes the plasma ion implantation apparatus (γ).

In FIG. 1(a), reference symbol 1a indicates a long film-like formed body (hereinafter referred to as "film") that includes a polysilane compound-containing layer in its surface, reference symbol 11a indicates a chamber, reference symbol 20a indicates a turbo-molecular pump, reference symbol 3a indicates a feed-out roll around which the film 1a is wound before ion implantation, reference symbol 5a indicates a wind-up roll around which an ion-implanted film (formed article) 1b is wound, reference symbol 2a indicates a high-voltage-applying rotary can, reference symbol 6a indicates a driving roll, reference symbol 10a indicates a gas inlet, reference symbol 7a indicates a high-voltage pulse power supply, and reference symbol 4 indicates a plasma discharge electrode (external electric field). FIG. 1(b) is a perspective view showing the high-voltage-applying rotary can 2a, wherein reference numeral 15 indicates a high-voltage application terminal (feed-through).

The long film 1a that includes a polysilane compound-containing layer in its surface is a film in which a polysilane compound-containing layer is formed on a base (additional layer).

In the continuous plasma ion implantation apparatus shown in FIG. 1, the film 1a is transferred from the feed-out roll 3a in an arrow direction X inside the chamber 11a, passes through the high-voltage-applying rotary can 2a, and is wound around the wind-up roll 5a. The film 1a may be wound and fed (carried) by an arbitrary method. In one embodiment, the film 1a is fed (carried) by rotating the high-voltage-applying rotary can 2a at a constant speed. The high-voltage-applying rotary can 2a is rotated by rotating a center shaft 13 of the high-voltage application terminal 15 using a motor.

The high-voltage application terminal 15, the driving rolls 6a that come in contact with the film 1a, and the like are formed of an insulator. For example, the high-voltage application terminal 15, the driving rolls 6a, and the like are formed by coating the surface of alumina with a resin (e.g., polytetrafluoroethylene). The high-voltage-applying rotary can 2a is formed of a conductor (e.g., stainless steel).

The feed speed of the film 1a may be appropriately set. The feed speed of the film 1a is not particularly limited as long as ions are implanted into the surface (polysilane compound-containing layer) of the film 1a so that the desired implanted layer is formed when the film 1a is fed from the feed-out roll 3a and wound around the wind-up roll 5a. The film winding speed (feed speed) is determined depending on the applied voltage, the size of the apparatus, and the like, but is normally 0.1 to 3 m/min, and preferably 0.2 to 2.5 m/min.

The pressure inside the chamber 11a is reduced by discharging air from the chamber 11a using the oil diffusion pump 20a connected to a rotary pump. The degree of decompression is normally $1\times10^{-2}$ Pa or less, and preferably $1\times10^{-3}$ Pa or less.

An ion implantation gas (e.g., nitrogen) is then introduced into the chamber 11a through the gas inlet 10a so that the chamber 11a is filled with the ion implantation gas under reduced pressure. Note that the ion implantation gas also serves as a plasma-generating gas.

Plasma is then generated using the plasma discharge electrode 4 (external electric field). The plasma may be generated by a known method using a high-frequency electric power supply (e.g., RF power supply or microwave power supply).

A negative high-voltage pulse 9a is applied from the high-voltage pulse power supply 7a connected to the high-voltage-applying rotary can 2a through the high-voltage application terminal 15. When a negative high-voltage pulse is applied to the high-voltage-applying rotary can 2a, ions present in plasma are attracted, and implanted into the surface of the film around the high-voltage-applying rotary can 2a (arrow Y in FIG. 1(a)) so that the film-shaped formed article 1b is obtained.

The pressure during ion implantation (i.e., the pressure of plasma gas inside the chamber 11a) is preferably 0.01 to 1 Pa. The pulse width during ion implantation is preferably 1 to 15 μsec. The applied voltage when applying a negative high voltage to the high-voltage-applying rotary can 2a is preferably −1 to −50 kV.

Figure 2:
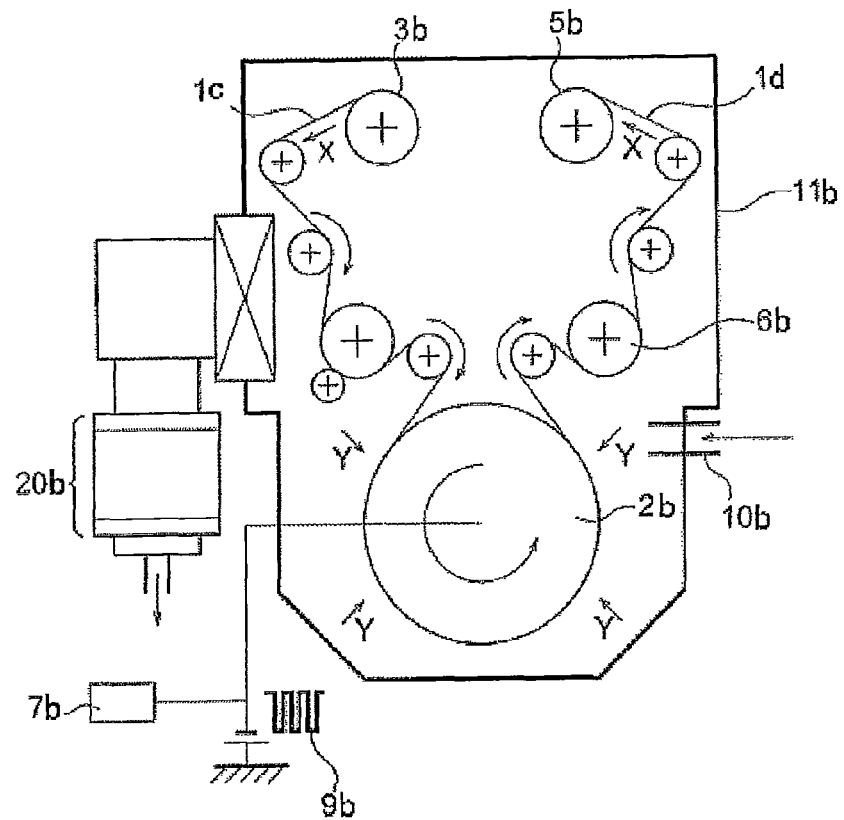
FIG. 2 is a view showing a schematic configuration of a plasma ion implantation apparatus used in the present invention.
Figure 3:
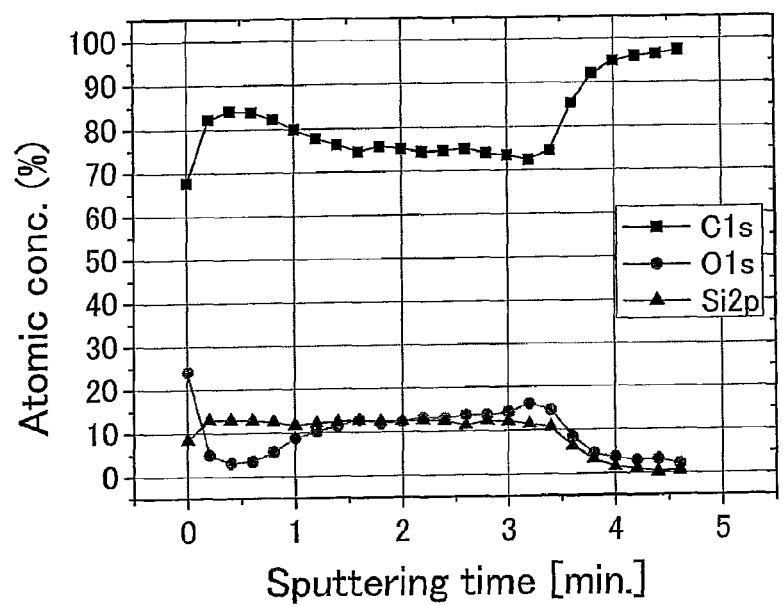
FIG. 3 is a view showing the oxygen atom content rate (%), the carbon atom content rate (%), and the silicon atom content rate (%) in the gas barrier layer of the formed article 1 of Example 1.
Figure 4:
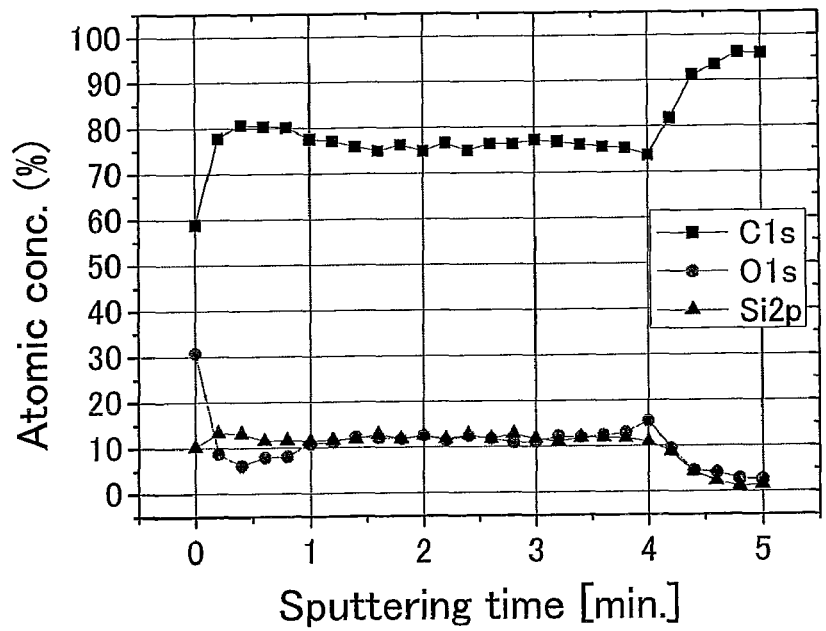
FIG. 4 is a view showing the oxygen atom content rate (%), the carbon atom content rate (%), and the silicon atom content rate (%) in the gas barrier layer of the formed article of Example 2.
Figure 5:
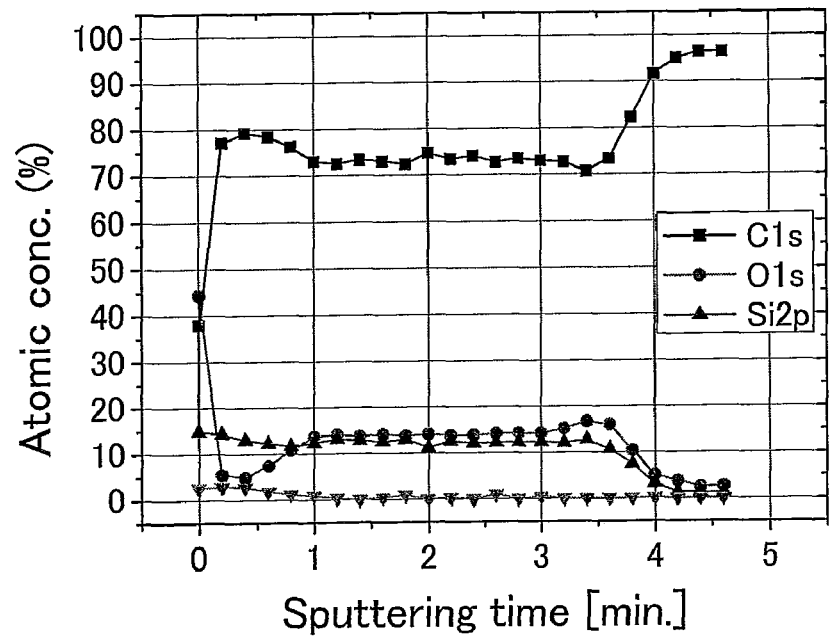
FIG. 5 is a view showing the oxygen atom content rate (%), the carbon atom content rate (%), and the silicon atom content rate (%) in the gas barrier layer of the formed article 3 of Example 3.
Figure 6:
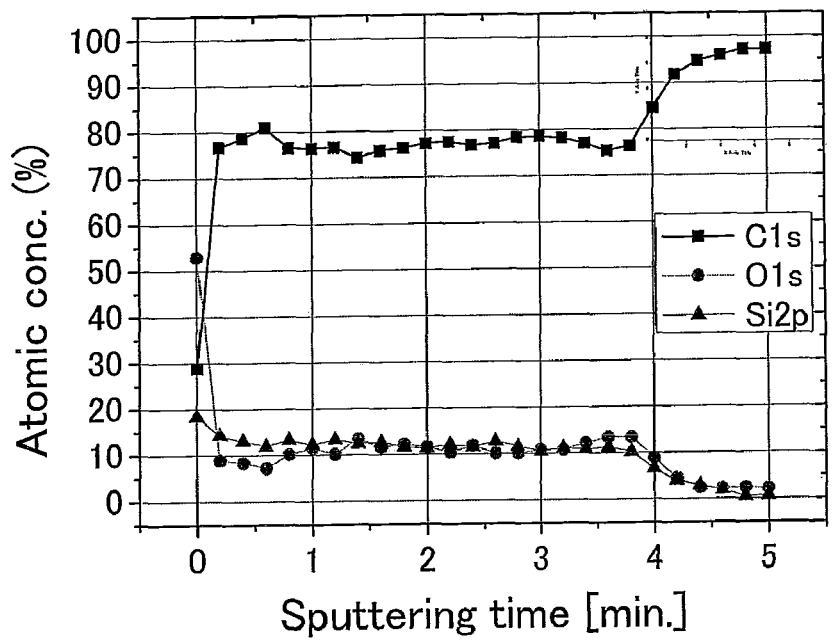
FIG. 6 is a view showing the oxygen atom content rate (%), the carbon atom content rate (%), and the silicon atom content rate (%) in the gas barrier layer of the formed article 4 of Example 4.
Figure 7:
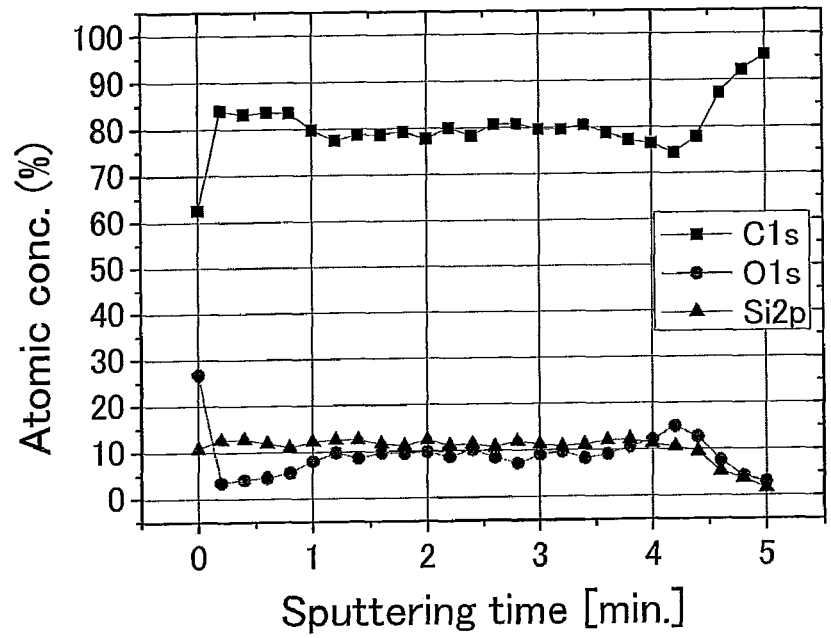
FIG. 7 is a view showing the oxygen atom content rate (%), the carbon atom content rate (%), and the silicon atom content rate (%) in the gas barrier layer of the formed article 5 of Example 5.
Figure 8:
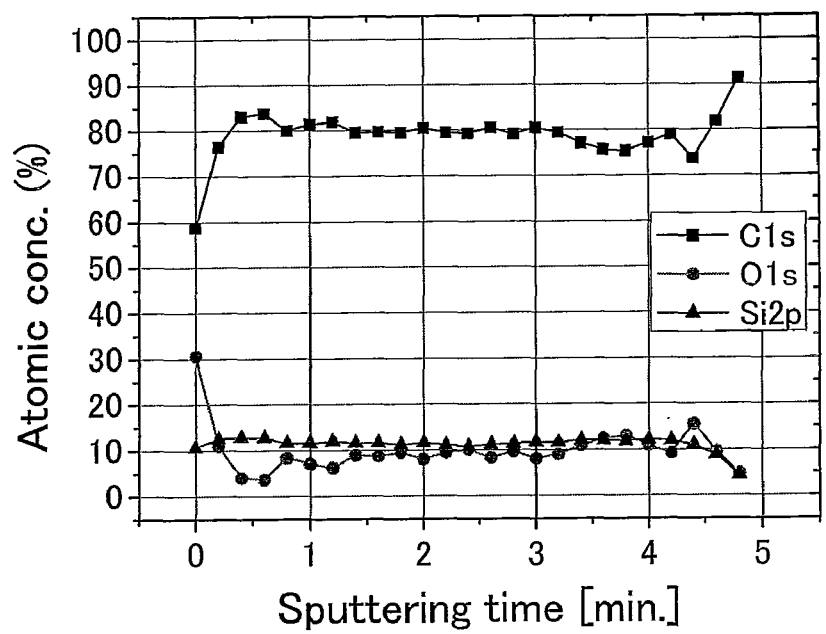
FIG. 8 is a view showing the oxygen atom content rate (%), the carbon atom content rate (%), and the silicon atom content rate (%) in the gas barrier layer of the formed article 6 of Example 6.
Figure 9:
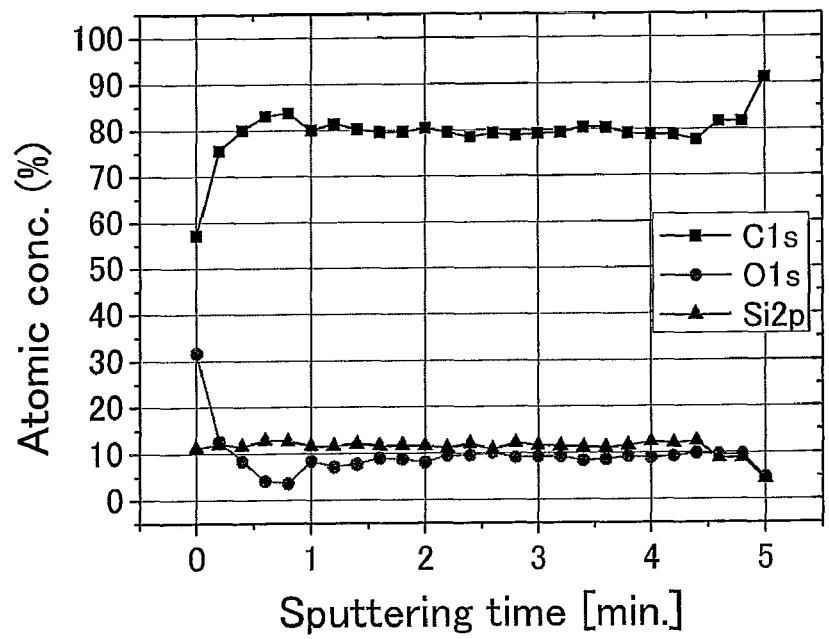
FIG. 9 is a view showing the oxygen atom content rate (%), the carbon atom content rate (%), and the silicon atom content rate (%) in the gas barrier layer of the formed article 7 of Example 7.
Figure 10:
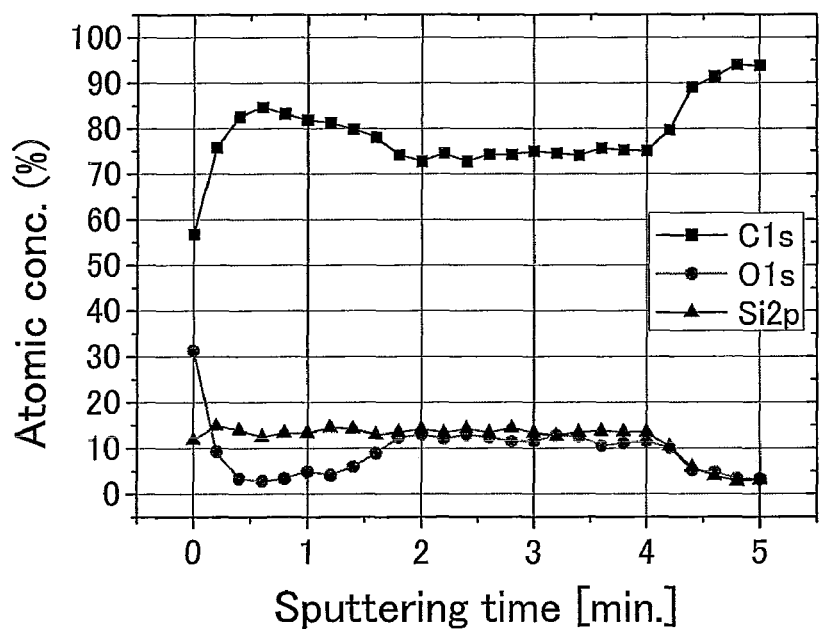
FIG. 10 is a view showing the oxygen atom content rate (%), the carbon atom content rate (%), and the silicon atom content rate (%) in the gas barrier layer of the formed article 8 of Example 8.

A method of implanting ions into a polysilane compound-containing layer of a film that includes the polysilane compound-containing layer in its surface using a continuous plasma ion implantation apparatus shown in FIG. 2 is described below.

The apparatus shown in FIG. 2 includes the plasma ion implantation apparatus described in (δ). The plasma ion implantation apparatus generates plasma by applying only an electric field due to a high-voltage pulse without using an external electric field (i.e., the plasma discharge electrode 4 shown in FIG. 1).

In the continuous plasma ion implantation apparatus shown in FIG. 2, a film 1c (film-shaped formed article) is fed in an arrow direction X shown in FIG. 2 by rotating a high-voltage-applying rotary can 2b, and wound around a wind-up roll 5b.

The continuous plasma ion implantation apparatus shown in FIG. 2 implants ions into the surface of the polysilane compound-containing layer of the film as follows.

The film 1c is placed in a chamber 11b in the same manner as the plasma ion implantation apparatus shown in FIG. 1. The pressure inside the chamber 11b is reduced by discharging air from the chamber 11b using an oil diffusion pump 20b connected to a rotary pump. An ion implantation gas (e.g., nitrogen) is introduced into the chamber 11b through a gas inlet 10b so that the chamber 11b is filled with the ion implantation gas under reduced pressure.

The pressure during ion implantation (i.e., the pressure of plasma gas inside the chamber 11b) is 10 Pa or less, preferably 0.01 to 5 Pa, and more preferably 0.01 to 1 Pa.

A high-voltage pulse 9b is applied from a high-voltage pulse power supply 7b connected to the high-voltage-applying rotary can 2b through a high-voltage application terminal (not shown) while feeding the film 1c in the direction X shown in FIG. 2.

When a negative high-voltage pulse is applied to the high-voltage-applying rotary can 2b, plasma is generated along the film 1c positioned around the high-voltage-applying rotary can 2b, and ions present in plasma are attracted, and implanted into the surface of the film 1c around the high-voltage-applying rotary can 2b (arrow Y in FIG. 2). When ions have been implanted into the surface of the polysilane compound-containing layer of the film 1c, an ion-implanted layer is formed in the surface of the film. A film-shaped formed article 1*d* is thus obtained.

The applied voltage and the pulse width employed when applying a negative high-voltage pulse to the high-voltage-applying rotary can 2*b*, and the pressure employed during ion implantation are the same as those employed when using the continuous plasma ion implantation apparatus shown in FIG. 1.

In the plasma ion implantation apparatus shown in FIG. 2, since the high-voltage pulse power supply also serves as a plasma generation means, a special means such as a high-frequency electric power supply (e.g., RF power supply or microwave power supply) is unnecessary. An ion-implanted layer can be continuously formed by implanting ions present in plasma into the surface of the polysilane compound-containing layer by merely applying a negative high-voltage pulse. Therefore, a formed article in which an ion-implanted layer is formed in the surface of a film can be mass-produced.

3) Electronic Device Member and Electronic Device

An electronic device member according to one embodiment of the invention includes the formed article according to one embodiment of the invention. Therefore, the electronic device member according to one embodiment of the invention exhibits an excellent gas barrier capability, so that a deterioration in the element due to gas (e.g., water vapor) can be prevented. Since the electronic device member exhibits excellent light transmittance, the electronic device member may suitably be used as a display member for liquid crystal displays, electroluminescence displays, and the like; a solar battery backsheet; and the like.

An electronic device according to one embodiment of the invention includes the electronic device member according to one embodiment of the invention. Specific examples of the electronic device include a liquid crystal display, an organic EL display, an inorganic EL display, electronic paper, a solar battery, and the like.

Since the electronic device according to one embodiment of the invention includes the electronic device member that includes the formed article according to one embodiment of the invention, the electronic device exhibits an excellent gas barrier capability and excellent bendability.

EXAMPLES

The invention is further described below by way of examples. Note that the invention is not limited to the following examples.

The following plasma ion implantation apparatus, water vapor transmission rate measuring apparatus, water vapor transmission rate measurement conditions, folding test method, surface flatness evaluation method, and adhesion evaluation method were used in the examples.

Plasma Ion Implantation Apparatus
RF power supply: "RF56000" manufactured by JEOL Ltd.
High-voltage pulse power supply: "PV-3-HSHV-0835" manufactured by Kurita Seisakusho Co., Ltd.
Water Vapor Transmission Rate Measuring Apparatus
Transmission rate analyzer: "L80-5000" manufactured by LYSSY
Measurement conditions: relative humidity: 90%, temperature: 40° C.
Folding Test The formed article was folded at the center so that the ion-implanted surface (side) (i.e., the surface of the polysilane compound-containing layer in Comparative Example 2, and the surface of the silicon nitride film in Comparative Example 4) was positioned outside. In this folding processing, the formed article was passed through the space between two rolls of a laminator ("LAMIPACKER LPC1502" manufactured by Fujipla, Inc.) at a laminating speed of 5 m/min and a temperature of 23° C.

The folding test was performed in a state in which a pasteboard (thickness: 1 mm) was provided on the inner side of the formed article.

Surface Flatness Evaluation Method
The surface roughness Ra (nm) (measurement area: 1×1 μm (1 μm square)) was measured using an atomic force microscope (AFM) ("SPA300HV" manufactured by SII Nano-Technology Inc.).

Adhesion Evaluation Method
Adhesion between the base film and the gas barrier layer was evaluated by a cross-cut test using an adhesive cellophane tape (in accordance with JIS K 5600-5-6). The adhesion was evaluated on a scale of 0 (good) to 5 (bad).

Example 1

A solution prepared by dissolving a polysilane compound containing a repeating unit shown by the formula (1) wherein $R^1=C_6H_5$ and $R^2=CH_3$ ("OGSOL SI10" manufactured by Osaka Gas Chemicals Co. Ltd., Mw=22,100) in a toluene/ethyl methyl ketone mixed solvent (toluene:ethyl methyl ketone=7:3, concentration: 5 wt %) was applied to a polyethylene terephthalate film ("PET38 T-100" manufactured by Mitsubishi Plastics Inc., thickness: 38 hereinafter referred to as "PET film") (as a base), and heated at 120° C. for 1 minute to form a polysilane compound-containing layer (thickness: 100 nm) (hereinafter referred to as "polysilane layer") on the PET film A formed body was thus obtained. Argon (Ar) ions were plasma-implanted into the surface of the polysilane layer using the plasma ion implantation apparatus shown in FIG. 2 to obtain a formed article 1.

The following plasma ion implantation conditions were employed.
Gas (argon) flow rate: 100 sccm
Duty ratio: 0.5%
Repetition frequency: 1000 Hz
Applied voltage: −10 kV
RF power supply: frequency: 13.56 MHz, applied electric power: 1000 W
Chamber internal pressure: 0.2 Pa
Pulse width: 5 μsec
Processing time (ion implantation time): 5 minutes
Line (feed) speed: 0.2 m/min Example 2

A formed article 2 was obtained in the same manner as in Example 1, except for using helium (He) as the plasma-generating gas instead of argon.

Example 3

A formed article 3 was obtained in the same manner as in Example 1, except for using nitrogen ($N_2$) as the plasma-generating gas instead of argon.

Example 4

A formed article 4 was obtained in the same manner as in Example 1, except for using oxygen ($O_2$) as the plasma-generating gas instead of argon.

Example 5

A formed article 5 was obtained in the same manner as in Example 1, except for using krypton (Kr) as the plasma-generating gas instead of argon.

Example 6

A formed article 6 was obtained in the same manner as in Example 1, except for changing the applied voltage during ion implantation to −15 kV.

Example 7

A formed article 7 was obtained in the same manner as in Example 1, except for changing the applied voltage during ion implantation to −20 kV.

Example 8

A formed article 8 was obtained in the same manner as in Example 1, except for using a mixture of a polysilane compound mainly containing a polyphenylsilane skeleton and a polyalkylsilane skeleton (Mw=1300) and an epoxy resin as a crosslinking agent ("OGSOL SI-20-12" manufactured by Osaka Gas Chemicals Co. Ltd.).

Comparative Example 1

The PET film was directly used as a formed article 9.

Comparative Example 2

A polysilane layer was formed on the PET film in the same manner as in Example 1 to obtain a formed article 10.

Comparative Example 3

A formed article was obtained in the same manner as in Example 1, except that the polysilane layer was not formed. Specifically, the PET film was ion-implanted in the same manner as in Example 1 to obtain a formed article 11.

Comparative Example 4

A silicon nitride (SiN) film (thickness: 50 nm) was formed on the PET film by sputtering to obtain a formed article 12.

Comparative Example 5

A urethane acrylate layer (thickness: 1 μm) ("URETHANE ACRYLATE 575BC" manufactured by Arakawa Chemical Industries, Ltd.) was formed instead of the polysilane layer, and ion-implanted in the same manner as in Example 1 to obtain a formed article 13.

The formed articles 1 to 8 and 10 obtained in Examples 1 to 8 and Comparative Example 2 were subjected to elemental analysis using an X-ray photoelectron spectroscopy (XPS) system ("Quantum 2000" manufactured by ULVAC-PHI, Incorporated) to analyze the oxygen atom content rate, the carbon atom content rate, and the silicon atom content rate in the depth direction from the surface of the gas barrier layer. The gas barrier layer was subjected to sputtering using argon gas, and the oxygen atom content rate, the carbon atom content rate, and the silicon atom content rate in the surface exposed by sputtering were measured. Each atom content rate in the depth direction were measured by repeating the operation that the sputtering and measuring). The results are shown in FIGS. 3 to 11.

X-ray source: AlKα
X-ray beam diameter: 100 μm
Electric power: 25 W
Voltage: 15 kV
Take-off angle: 45°
Degree of vacuum: $5.0 \times 10^{-8}$ Pa In FIGS. 3 to 11, the vertical axis indicates the oxygen atom content rate (%), the carbon atom content rate (%), and the silicon atom content rate (%) based on the total content rate (=100%) of oxygen atoms, carbon atoms, and silicon atoms, and the horizontal axis indicates the cumulative sputtering time (Sputter time (min)) Since the sputtering rate was constant, the cumulative sputtering time (Sputter time) corresponds to the depth. In FIGS. 3 to 11, a square mark (C1s) indicates the carbon atom content rate, a round mark (O1s) indicates the oxygen atom content rate, and a triangular mark (Si2p) indicates the silicon atom content rate.

Table 1 shows the measurement results for the oxygen atom content rate, the carbon atom content rate, and the silicon atom content rate in the plasma ion-implanted surface (the surface of the polysilane layer in Comparative Example 2).

TABLE 1

| | | Content rate (%) | | |
|---|---|---|---|---|
| | Formed article | Carbon atom | Oxygen atom | Silicon atom |
| Example 1 | 1 | 67.6 | 24.1 | 8.3 |
| Example 2 | 2 | 58.9 | 30.8 | 10.3 |
| Example 3 | 3 | 38.9 | 45.3 | 15.8 |
| Example 4 | 4 | 28.8 | 52.9 | 18.3 |
| Example 5 | 5 | 62.5 | 26.8 | 10.7 |
| Example 6 | 6 | 58.8 | 30.6 | 10.6 |
| Example 7 | 7 | 57.1 | 31.6 | 11.2 |
| Example 8 | 8 | 56.8 | 31.4 | 11.8 |
| Comparative Example 2 | 9 | 86.5 | 2.4 | 11.1 |

As shown in Table 1 and FIGS. 3 to 10, it was confirmed that the formed articles 1 to 8 included an area where the oxygen atom content rate gradually decreases, and the carbon atom content rate gradually increases in the depth direction from the surface, the area including a partial area (A1) and a partial area (A2), the partial area (A1) having an oxygen atom content rate of 20 to 55%, a carbon atom content rate of 25 to 70%, and a silicon atom content rate of 5 to 20% based on the total content rate of oxygen atoms, carbon atoms, and silicon atoms, and the partial area (A2) having an oxygen atom content rate of 1 to 15%, a carbon atom content rate of 72 to 87%, and a silicon atom content rate of 7 to 18% based on the total content rate of oxygen atoms, carbon atoms, and silicon atoms.

Figure 11:
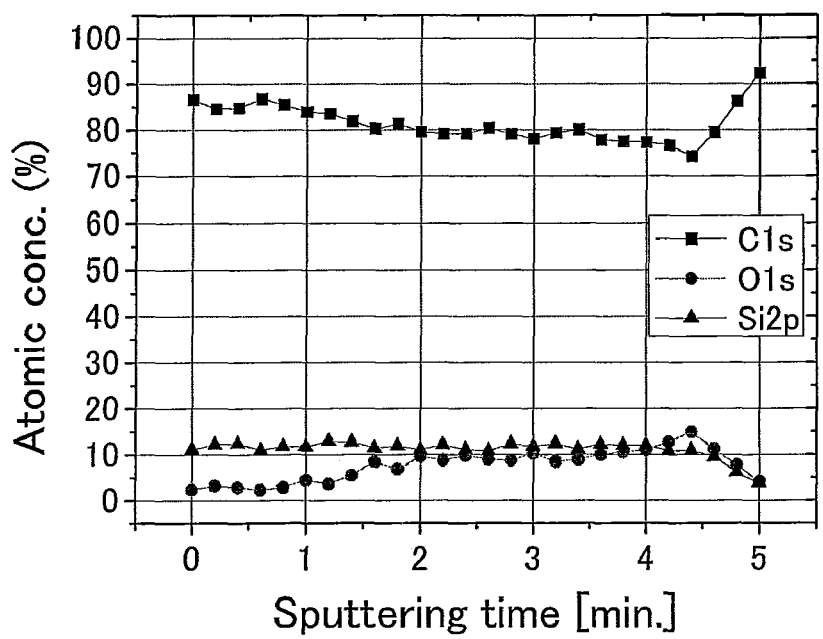
FIG. 11 is a view showing the oxygen atom content rate (%), the carbon atom content rate (%), and the silicon atom content rate (%) in the gas barrier layer of the formed article 10 of Comparative Example 2.

As shown in Table 1 and FIG. 11, the formed article 11 obtained in Comparative Example 2 did not have the partial area (A1).

The formed articles 1 to 13 obtained in Examples 1 to 8 and Comparative Examples 1 to 5 were subjected to measurement of the water vapor transmission rate and the surface roughness (Ra), and the adhesion test. The measurement results and the evaluation results are shown in Table 2.

The formed articles 1 to 13 were subjected to the folding test, and the water vapor transmission rate was measured after the folding test. The measurement results are shown in Table 2.

TABLE 2

| Formed article | Water vapor transmission rate (g/m²/day) Before folding test | Water vapor transmission rate (g/m²/day) After folding test | Ra (nm) | Adhesion test (0 (good) to 5 (bad)) |
|---|---|---|---|---|
| Example 1 | 1 | 0.20 | 0.62 | 0.23 | 0 |
| Example 2 | 2 | 0.15 | 0.55 | 0.19 | 0 |
| Example 3 | 3 | 0.24 | 0.58 | 0.40 | 0 |
| Example 4 | 4 | 0.18 | 0.44 | 0.32 | 0 |
| Example 5 | 5 | 0.20 | 0.52 | 0.14 | 0 |
| Example 6 | 6 | 0.13 | 0.34 | 0.12 | 0 |
| Example 7 | 7 | 0.12 | 0.30 | 0.10 | 0 |
| Example 8 | 8 | 0.15 | 0.20 | 0.30 | 0 |
| Comparative Example 1 | 9 | 13.7 | 14.0 | 0.98 | — |
| Comparative Example 2 | 10 | 13.5 | 13.5 | 1.05 | 0 |
| Comparative Example 3 | 11 | 7.98 | 9.37 | 0.33 | — |
| Comparative Example 4 | 12 | 0.55 | 1.21 | 1.60 | 1 |
| Comparative Example 5 | 13 | 10.0 | 13.3 | 0.55 | 1 |

As shown in Table 2, the formed articles 1 to 8 obtained in Examples 1 to 8 had a low water vapor transmission rate (i.e., excellent gas barrier capability) as compared with the formed articles 9 to 13 obtained in Comparative Examples 1 to 5. The formed articles 1 to 8 also exhibited excellent surface flatness and excellent adhesion. The formed articles 1 to 8 showed a small increase in water vapor transmission rate after the folding test (i.e., exhibited excellent bendability).

LIST OF REFERENCE SYMBOLS 1a, 1c: Film-shaped formed body
1b, 1d: Film-shaped formed article
2a, 2b: Rotary can
3a, 3b: Feed-out roll
4: Plasma discharge electrode
5a, 5b: Wind-up roll
6a, 6b: Driving roll
7a, 7b: Pulse power supply
9a, 9b: High-voltage pulse
10a, 10b: Gas inlet
11a, 11b: Chamber
13: Center shaft
15: High-voltage application terminal
20a, 20b: Oil diffusion pump

The invention claimed is:

1. A method of producing a formed article having a gas barrier layer, the method comprising:
   implanting ions into a polysilane compound-containing layer containing 50 wt % or more of a polysilane compound of a formed article by a plasma ion implantation method to form the formed article having the gas barrier layer wherein said gas barrier layer is formed by said plasma ion implantation,
   wherein the formed article prior to said plasma ion implantation includes the polysilane compound-containing layer in its surface,
   wherein the gas barrier layer includes an area (A) where an oxygen atom content rate gradually decreases, and where a carbon atom content rate gradually increases in a depth direction from a surface,
   wherein the area (A) includes a partial area (A1) and a partial area (A2), the partial area (A1) having an oxygen content rate of 20 to 55%, a carbon atom content rate of 25 to 70%, and a silicon atom content rate of 5 to 20% based on the total content rate of oxygen atoms, carbon atoms, and silicon atoms, and the partial area (A2) having an oxygen atom content rate of 1 to 15%, a carbon atom content rate of 72 to 87% and a silicon atom content rate of 7 to 18% based on the total content rate of oxygen atoms, carbon atoms and silicon atoms, and
   wherein the ions are obtained by ionizing at least one as selected from the group consisting of hydrogen, nitrogen, argon, helium, neon, xenon, krypton, a silicon compound, and a hydrocarbon.

2. The method according to claim 1, wherein the formed article having the gas barrier layer has a water vapor transmission rate at a temperature of 40° C. and a relative humidity of 90% of 0.35 g/m²/day or less.

3. The method according to claim 1, wherein the polysilane compound is a compound having a repeating unit shown by a formula (1):

(1)

wherein $R^1$ and $R^2$ individually represent a hydrogen atom, an alkyl group, an alkenyl group, a cycloalkyl group, a cycloalkenyl group, an aryl group, a hydroxyl group, an alkoxy group, a cycloalkyloxy group, an aryloxy group, an aralkyloxy group, a substituted or unsubstituted amino group, a sill group, or a halogen atom, wherein $R^1$ and $R^2$ are the same or different from each other; and
wherein the weight average molecular weight of the polysilane compound is 300 to 100,000.

4. The method according to claim 1, wherein the step of implanting ions by the plasma ion implantation method is a process of forming the ion implanted layer by implanting ions in plasma into the polysilane compound-containing layer containing 50 wt % or more of the polysilane compound by applying a negative high-voltage pulse to the formed article having the layer containing 50 wt % or more of the polysilane compound that is exposed in plasma.

5. The method according to claim 4, wherein a voltage applied when applying the negative high voltage pulse is −1 kV to −50 kV.

6. The method according to claim 1, wherein the step of implanting ions by the plasma ion implantation method is a process comprising implanting ions into the polysilane compound-containing layer of the formed article while feeding the formed article in a given direction.

* * * * *